(12) United States Patent
Ngo et al.

(10) Patent No.: US 6,201,303 B1
(45) Date of Patent: Mar. 13, 2001

(54) METHOD OF FORMING A LOCAL INTERCONNECT WITH IMPROVED ETCH SELECTIVITY OF SILICON DIOXIDE/SILICIDE

(75) Inventors: Minh Van Ngo, Fremont, CA (US); Paul R. Besser, Austin, TX (US); Yowjuang Bill Liu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/417,842

(22) Filed: Oct. 14, 1999

(51) Int. Cl.[7] .......................... H01L 23/48; H01L 23/52; H01L 29/40
(52) U.S. Cl. .......................... 257/768; 257/758; 438/740
(58) Field of Search .................................. 257/770, 769, 257/750, 758, 768; 438/651, 655, 682, 740, 755

(56) References Cited

U.S. PATENT DOCUMENTS

| 5,888,588 | * | 3/1999 | Nagabushnam . |
| 5,928,967 | * | 7/1999 | Radens et al. . |
| 5,985,765 | * | 11/1999 | Hsio et al. . |
| 6,030,847 | * | 2/2000 | Fazan et al. . |
| 6,046,103 | * | 4/2000 | Thei et al. . |
| 6,111,298 | * | 8/2000 | Gardner et al. . |
| 6,124,172 | * | 9/2000 | Garner et al. . |

* cited by examiner

Primary Examiner—Sheila V. Clark

(57) ABSTRACT

A method and arrangement for forming a local interconnect without weakening the field edge or disconnecting the diffusion region at the field edge introduces additional nitrogen by ion implantation into a nitrogen-containing etch stop layer (e.g., SiON) that has already been deposited, by plasma enhanced chemical vapor deposition (PECVD), for example. The enriched nitrogen etch stop layer is harder to etch than conventional PECVD SiON so that when etching the dielectric layer in which the local interconnect material is subsequently deposited, the etching stops at the etch stop layer in a controlled manner. This prevents the unintentional etching of the silicide region and diffusion region at the field edge.

18 Claims, 3 Drawing Sheets

METHOD OF FORMING A LOCAL INTERCONNECT WITH IMPROVED ETCH SELECTIVITY OF SILICON DIOXIDE/SILICIDE

FIELD OF THE INVENTION

The present invention relates to the formation of local interconnects in semiconductor processing technology, and more particularly, to the improvement of etch selectivity of an etch stop layer with respect to layers below and above the etch stop layer to prevent the disconnection of diffusion regions at field edges.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semiconducting regions (e.g., active regions of one or more devices). For example, a plurality of transistors can be connected to form an inverting logical circuit using local interconnects.

The local interconnect is typically a relatively low resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or a trench that connects the selected regions together. The use of local interconnects reduces the coupling burden on the subsequently formed higher layers to provide such connectivity, which reduces the overall circuit size and as such tends to increase the circuit's performance. Accordingly, as the density of the circuits increases there is a continuing need for more efficient, effective and precise processes for forming smaller local interconnects.

A problem arises in the formation of a local interconnect due to the relatively poor etch selectivity of the oxide dielectric material to the etch stop layer typically used to prevent overetching into a diffusion region. The overetching may lead to disconnection of the diffusion region at a field edge and result in a poor interconnection. This may best be understood by reference to FIGS. 1–3 to illustrate the concern.

FIG. 1 depicts a cross-section of a semiconductor device arrangement during one step of a local interconnect formation process. A silicon substrate 10 has polycrystalline silicon (hereafter polysilicon) gates 12 and 14 formed thereon. The polysilicon gate 14 is actually formed on the field oxide 16. A spacer 15 (such as an oxide spacer) provides a shielding of the substrate 10 directly under the spacer 15 during implantation or diffusion of dopant substrate 10.

A plurality of silicide regions 18 are formed through conventional silicide techniques, for example, in a self-aligned silicide ("salicide") technique. The material comprising the silicide regions 18 may be selected from different materials, such as titanium silicide, cobalt suicide, tungsten silicide, etc. Silicide regions 18 provide a low resistance contact for the semiconductor devices.

The doped active region 20 is provided in the substrate 10 as defined by the doping. Typically, a heating step is performed to activate the dopants following the introduction of the dopants into the substrate 10.

An etch stop layer 22 is conformally deposited over the semiconductor wafer. An exemplary material for the etch stop layer is silicon oxynitride (SiON) and a conventional method of deposition is plasma enhanced chemical vapor deposition (PECVD). A layer of dielectric material, such as silicon dioxide derived from tetraethyl orthosilicate (TEOS), is deposited over the etch stop layer 22 and planarized. The dielectric layer 24 is then covered with a photoresist mask 26 which is patterned and developed with the desired local interconnect opening that is to be etched in the dielectric layer 24. In this example of FIG. 1, the opening in the photoresist layer 26 is positioned to provide a local interconnect opening in the dielectric layer 24 that will eventually connect the gate 14 of one device with the active region 20 of another device.

An etching step is then performed that etches through the dielectric layer 24 in accordance with the pattern in the photoresist layer 26. It is desirable to stop this first etching step at the etch stop layer 22. However, as depicted in FIG. 2, it is often difficult to precisely stop the etch at the etch stop layer 22, especially at the edge of the field 16. In this circumstance, the local interconnect opening 28 undesirably extends into the substrate 10 at area 30. The unintended etching through the etch stop layer 22 allows the etchant to etch the silicide region 18 and the diffusion region 20, creating the dip 30 into the substrate 10.

As seen in FIG. 3, after the deposition of a liner (or "barrier layer") that prevents diffusion of the conductive material into the other areas of the device, the local interconnect opening 28 is filled with a conductive material, such as tungsten 34. However, there remains a disconnection of the diffusion region 20 at the edge of the field 16, caused by the overetching through the etch-stop layer 22 during the etching of the dielectric layer 24. This disconnection and the reduced contact of the conductive metal 34 to the silicide region 18 of the diffusion region 20 decreases the performance of the circuit, and in extreme circumstances, may cause circuit failure.

There is a need for an improved etch selectivity to prevent the weakness at the field edge and disconnection of the diffusion region during a local interconnect formation process.

SUMMARY OF THE INVENTION

This and other needs are met by the present invention which provides a method of forming a local interconnect comprising the steps of forming devices on a semiconductor wafer and forming silicide regions on the devices. A nitrogen containing etch stop layer is deposited over the devices and the suicide regions. Nitrogen is then implanted into the nitrogen-containing etch stop layer to introduce additional nitrogen into the etch stop layer. A dielectric layer is deposited on the etch stop layer and etched in accordance with a desired pattern with an etchant chemistry that is selective to the etch stop layer to form a local interconnect opening. This etch stop layer is then etched in accordance with the desired pattern with an etchant chemistry that is selective to the silicide regions. Conductive material is deposited in the local interconnect opening.

The implanting of nitrogen (e.g., by ion implantation) into the nitrogen-containing etch stop layer (such as conventional PECVD SiON) introduces additional nitrogen into the etch stop layer, making it "nitrogen-rich". The additional nitrogen makes the etch stop layer slower to etch than conventionally deposited silicon oxynitride (PECVD SiON). Hence, the slowing down of the etch rate of the etch stop layer to an etchant chemistry used to etch the overlying dielectric layer increases the etch selectivity of the etch stop layer in comparison to untreated PECVD SiON. By improving the etch selectivity, the control of the etching process is increased so that the etching of the dielectric layer may be precisely stopped at the etch stop layer. This prevents the disconnection of the diffusion region at the field edge.

The earlier stated needs are met by another embodiment of the present invention which provides a local interconnect arrangement comprising a substrate layer and semiconductor devices that are on the substrate. Silicide regions are provided on the semiconductor devices. A nitrogen-rich etch stop layer is located on portions of some of the silicide regions, the etch stop layer including implanted nitrogen. A dielectric layer is on the etch stop layer. A local interconnect opening extends through the dielectric layer and the etch stop layer to at least one of the silicide regions. Conductive material fills the local interconnect opening and contacts at least one of the silicide regions.

The arrangement according to the present invention includes a nitrogen-rich etch stop layer that is a dielectric material so that it may remain within the structure, but is slower to etch than conventional etch stop layers due to the increased amount of nitrogen that was implanted. This prevents unintentional overetching during the etching of the dielectric layer that is on the etch stop layer. Hence, the local interconnect opening that is formed does not exhibit weakness at the field edge and the diffusion region of a semiconductor device is not disconnected at the field edge.

The earlier stated needs are also met by another embodiment of the present invention which provides a method for increasing the selectivity of etchants with respect to an etch stop layer. A silicide region is formed, followed by formation of a nitrogen containing etch stop layer on the suicide region by plasma enhanced chemical vapor deposition. Nitrogen is implanted in the deposited etch stop layer to enrich the nitrogen content of the etch stop layer. A dielectric layer is formed on the etch stop layer. The etch rate of the etch stop layer is substantially slower than the etch rate of the dielectric layer when exposed to a first etchant chemistry. The etch rate of the silicide region is substantially slower than the etch rate of the etch stop layer when exposed to a second etchant chemistry.

The foregoing and other features, aspect and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION OF THE INVENTION

The present invention solves the problem of weakness at the field edge and the disconnection of a diffusion region at the field edge during local interconnect formation. This is accomplished by improving the selectivity of the etch stop layer. The amount of nitrogen in a nitrogen-containing etch stop layer is increased by the implantation of nitrogen ions into the etch stop layer. The enriching of the nitrogen content in a conventionally deposited nitrogen-containing etch stop layer, such as PECVD SiON, makes it slower to etch than a non-enriched etch stop layer, so that the etch stop layer better prevents unintentional etching of the silicide regions or diffusion region near the field edge during the etching of the dielectric layer. The greater selectivity and etching control allows the local interconnect formation to be performed with more precision, thereby preventing weakness at the field edge.

Figure 4:
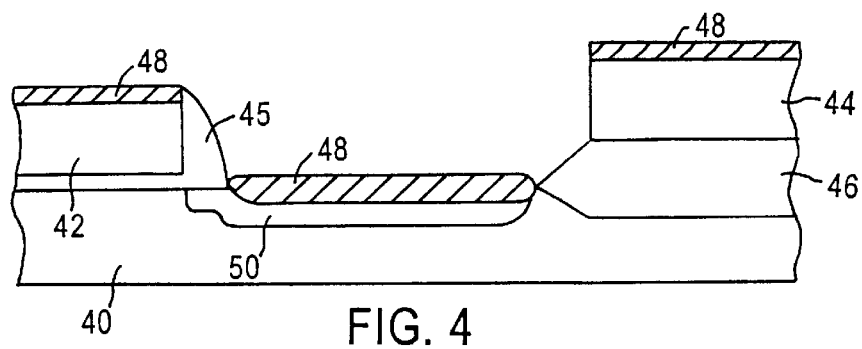
FIG. 4 is a cross-section of a portion of a semiconductor wafer during a step of a manufacturing process in accordance with an embodiment of the present invention.

FIG. 4 depicts the cross-section of a portion of a semiconductor wafer during one step of a manufacturing process in accordance with the embodiments of the present invention. A substrate 40, made of silicon, for example, has a polysilicon gate 42 formed over a gate oxide. Sidewall spacers 45, made of oxide, for example, are formed in a conventional manner on the walls of the polysilicon gate 42. A diffusion region 50 is formed in the substrate 40 by conventional doping techniques (e.g. ion implantation, following sidewall spacer formation). A field region 46 isolates the device on the left hand side of FIG. 4 from other devices in the wafer. A polysilicon gate 44 or interconnect is formed on the field oxide 46. Silicide regions 48 are formed in a conventional manner, for example, on the polysilicon and silicon regions of the wafer. The silicide may be cobalt silicide, titanium silicide, tungsten silicide, nickel silicide, for example. In the following example, the silicide region 48 over the gate 44 is to be connected with the silicide region 48 over the diffusion region 50. In conventional processing, the formation of the local interconnect may create a weakening at the edge of the field oxide 46 and disconnection of the diffusion region 50 due to overetching through an etch stop layer, as explained earlier.

Figure 1:
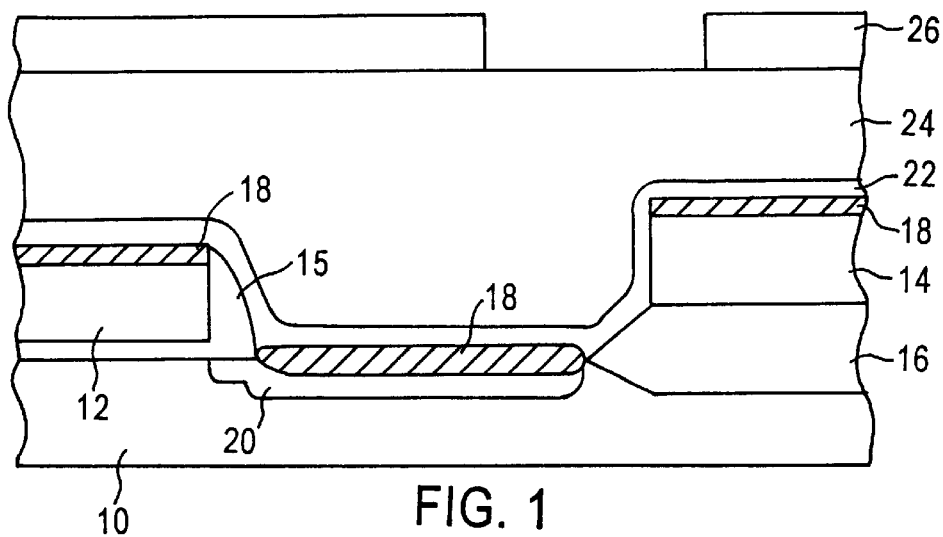
FIG. 1 depicts a cross-section of a semiconductor wafer prior to the etching of a local interconnect opening in a dielectric layer.
Figure 2:
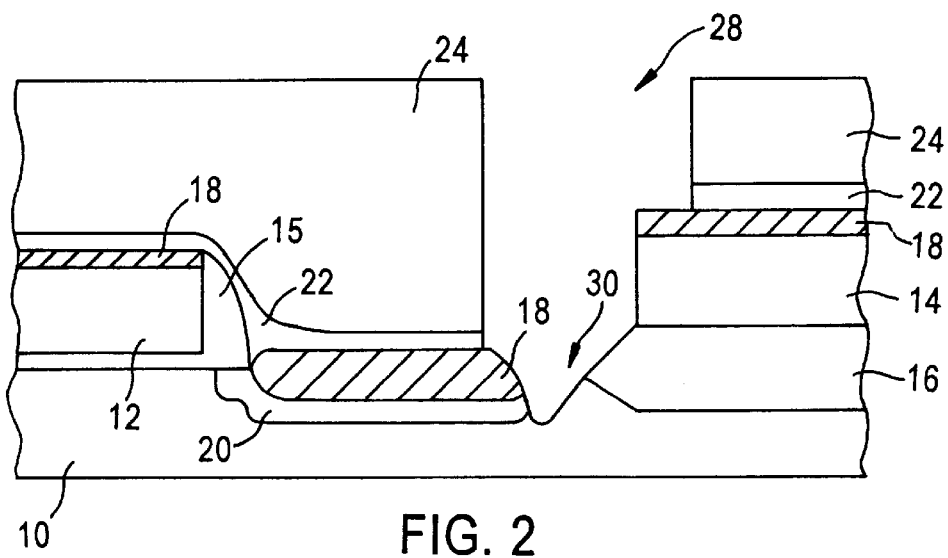
FIG. 2 depicts the cross-section of the portion of FIG. 1 following etching through of the dielectric layer and an etch stop layer in accordance with conventional etching techniques.
Figure 3:
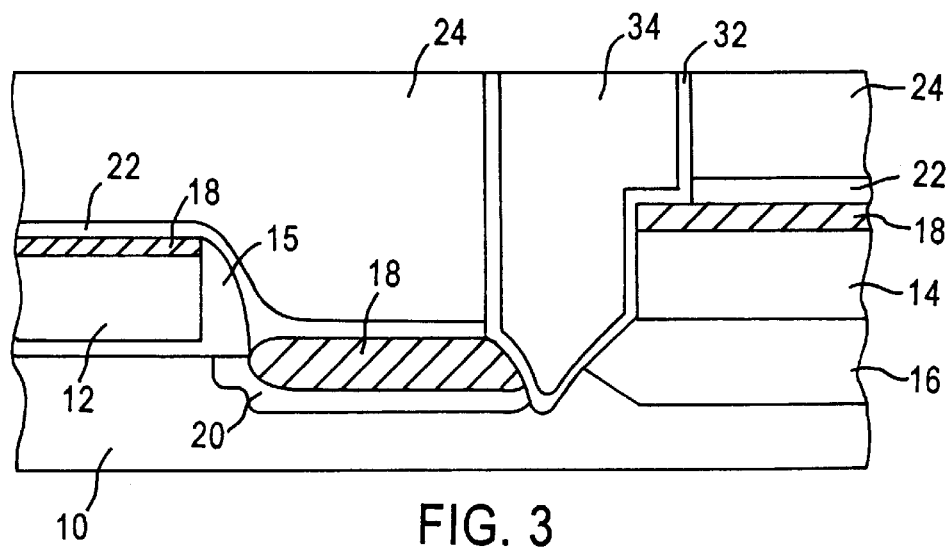
FIG. 3 depicts the formation of a local interconnect by the filling of a local interconnect opening with a barrier layer and a conductive material, and exhibits a disconnection of the diffusion region at a field edge.
Figure 5:
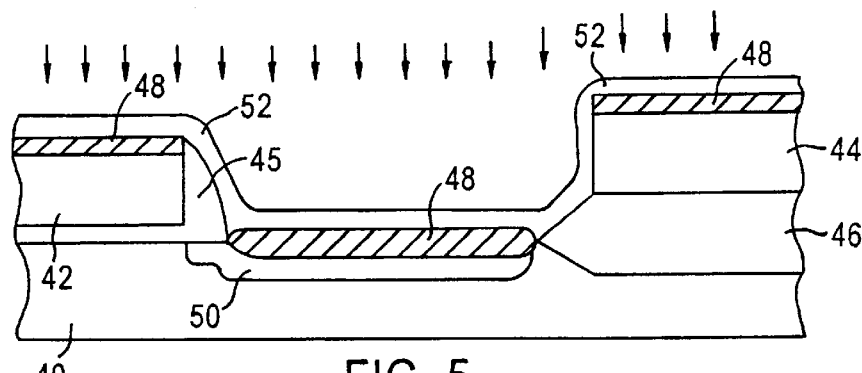
FIG. 5 is a cross-section of the portion of FIG. 4 following deposition of an etch stop layer and during ion implantation of nitrogen in the etch stop layer in accordance with an embodiment of the present invention.

The present invention provides an enriched nitrogen film as an etch stop layer as depicted in FIG. 5. To form the enriched nitrogen film, a nitrogen-containing etch stop layer 52 is first deposited, by plasma enhanced chemical vapor deposition (PECVD), for example. A conventional material may be used to initially form the etch stop layer, such as silicon oxynitride (SiON) or silicon nitride (SiN). However, as discussed earlier, conventional PECVD SiON does not have enough etch selectivity to assure prevention of a disconnection of the diffusion region at a field edge, as shown in FIGS. 1–3. To overcome this problem, the present invention introduces additional nitrogen into the etch stop layer 52. In preferred embodiments of the invention, the additional nitrogen is introduced by implanting additional nitrogen into the nitrogen containing etch stop layer 52. The amount of additional nitrogen introduced into the etch stop layer 52 may be varied by changing the implantation parameters.

The nitrogen implantation may be performed in a conventional ion implantation tool. Nitrogen gas is provided, and a dose of approximately $1 \times 10^{12}$ to approximately $1 \times 10^{16}$ ions/cm$^2$ is produced. The ions are preferably provided with an implantation energy of between about 15 KeV and about 200 KeV. These values will typically implant the ions to a depth of about 600 Å in a layer of SiON. After the implantation of the nitrogen, the now nitrogen-enriched etch stop layer 52 is slower to etch so that the etch selectivity is improved.

Figure 6:
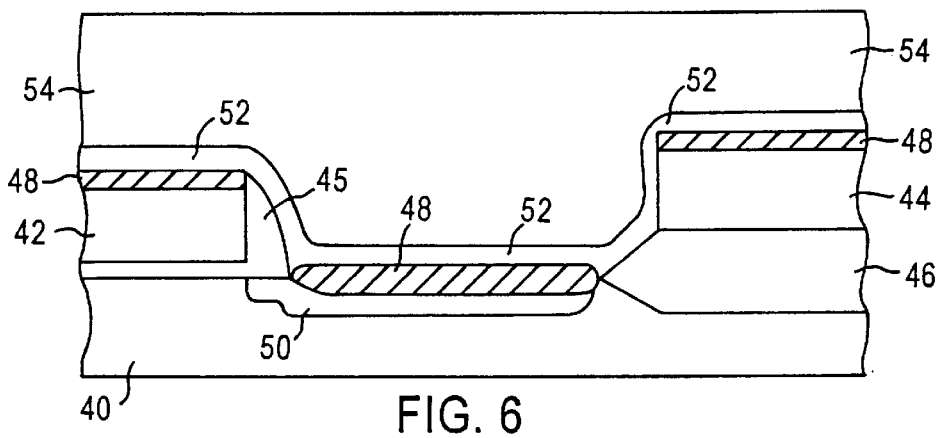
FIG. 6 depicts the portion of FIG. 5 following the conformal deposition and planarization of a dielectric layer over the etch stop layer.
Figure 7:
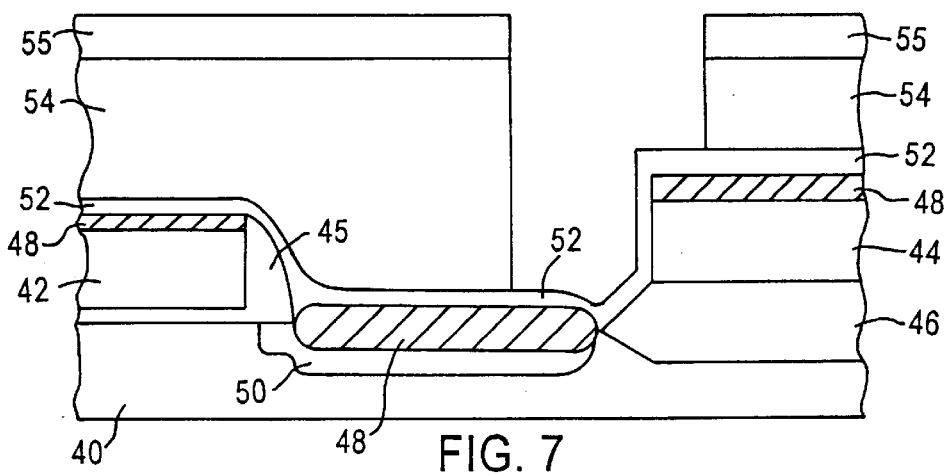
FIG. 7 is a cross-section of the portion of FIG. 6 after exposure to a first etchant chemistry which etches the dielectric material and is selective to the etch stop layer, in accordance with embodiments of the present invention.

A dielectric layer 54, such as silicon dioxide derived from tetraethyl orthosilicate (TEOS), is conformally deposited over the etch stop layer 52 and then planarized. This is depicted in the cross-section of the portion of the semiconductor wafer of FIG. 6. Following the deposition and planarization of the dielectric layer 54, a photoresist layer 55 is deposited, patterned and developed on the dielectric layer 54 with an opening through which the local interconnect opening is to be etched in the dielectric layer 54. This is depicted in FIG. 7. The dielectric layer is then etched with a first etchant chemistry, such as $C_4F_8$, that etches the dielectric layer 54 and stops on the etch stop layer 52. In contrast to conventional etch stop layers 52, the enriched nitrogen etch stop layer 52 of the present invention is harder to etch so that the exemplary etchant described above is more highly selective to the etch stop layer 52. This prevents an unintended etching of the silicide region 48 and the diffusion region 50 at the edge of the field 46. The etch rate of silicon dioxide is approximately 5500 Å/min. when etched with the exemplary first etchant chemistry. By contrast, the etch rate of enriched nitrogen SiON is approximately 300 Å/min. when etched with the exemplary first etchant chemistry.

Figure 8:
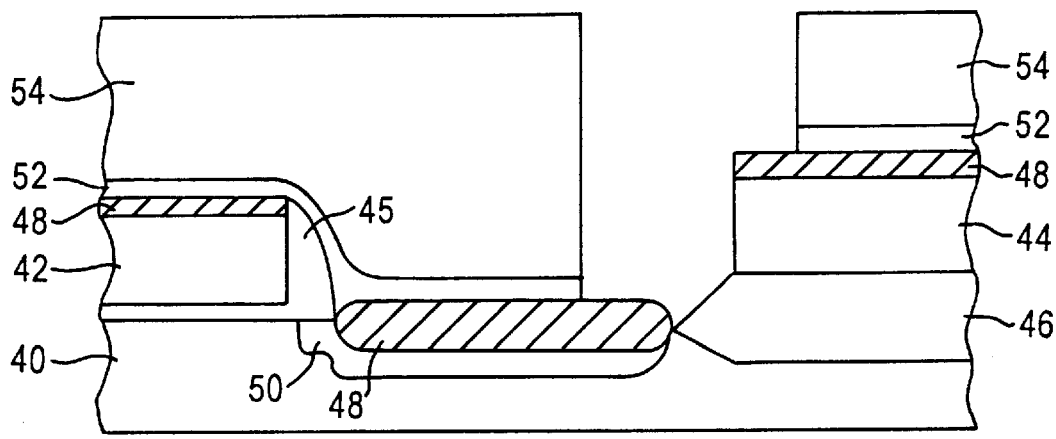
FIG. 8 depicts the cross-section of the portion of FIG. 7 after exposure to a second etchant chemistry that etches the etch stop layer and is selective to silicide, in accordance with embodiments of the present invention.

FIG. 8 depicts the portion of the semiconductor wafer of FIG. 7 following the removal of the etch stop layer 52 within the local interconnect opening defined by the pattern in the photoresist layer 55. The etch stop layer 52 is etched by exposure to a second etchant chemistry that is highly selective to the silicide regions 48 so that only the etch stop layer 52 is etched in this step. A suitable exemplary etchant chemistry that is selective to the silicide is $CH_3FO_2$. The etch rate of nitrogen enriched SiON is approximately 1500 Å/min. when etched with the exemplary second etchant chemistry, while the etch rate of a typical silicide, such as cobalt silicide, is 10 to 30 Å/min. when etched with the exemplary second etchant chemistry. In the present invention, the disconnection of the diffusion region 50 is avoided during the etching of the etch stop layer 52.

Figure 9:
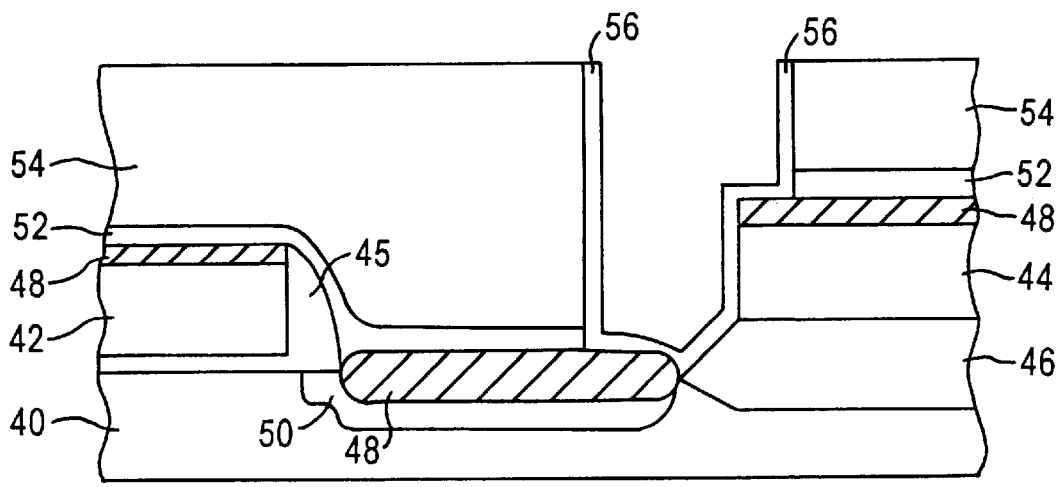
FIG. 9 is a cross-section of the portion of FIG. 8 following the deposition of a barrier layer within the local interconnect opening formed by the etching of the dielectric layer and the etch stop layer, in accordance with embodiments of the present invention.

FIG. 9 depicts the portion of the semiconductor wafer of FIG. 8 after a barrier layer, such as TiN, has been deposited within the local interconnect opening. The barrier layer 56 prevents the diffusion of subsequently deposited conductive material to other areas of the semiconductor wafer. A suitable exemplary material for the barrier layer 56 is TiN, although other materials may be used.

Figure 10:
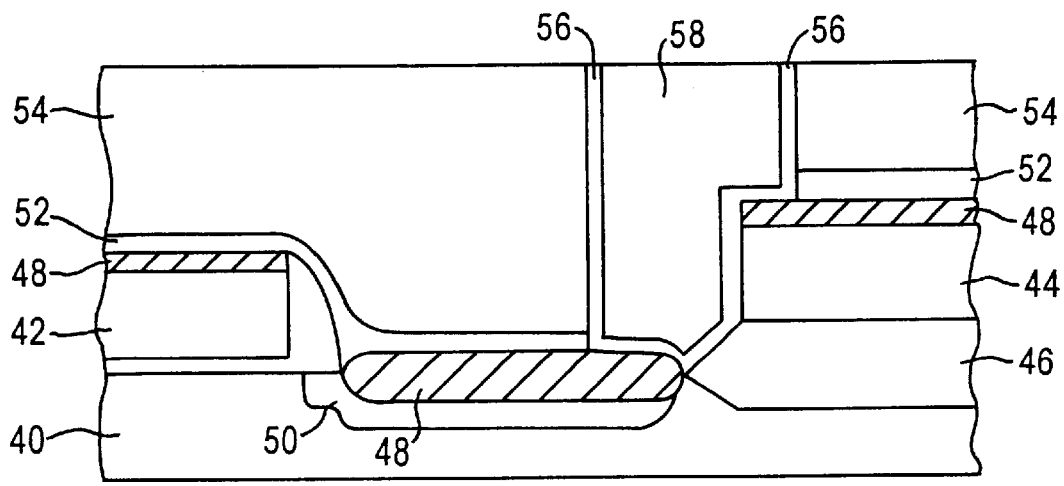
FIG. 10 is a cross-section of the portion of FIG. 9 after the deposition of a conductive material within the local interconnect opening, in accordance with embodiments of the present invention.

FIG. 10 is a cross-section of the portion of FIG. 9 following the deposition of a conductive material 58 within the local interconnect opening. For example, the conductive material may be tungsten (W). The local interconnect formed by the conductive material 58 makes electrical contact, through the barrier layer 56, with the silicide regions 48 over the diffusion region 50 and the polysilicon gate 44 respectively. As seen from this figure, the local interconnect structure of the present invention is formed without a weakening at the edge of the field 46 or disconnection of the diffusion region 50 at the edge of the field 46.

The present invention avoids a disconnection of the diffusion region at the field edge by providing an improved etch stop layer to which an etchant chemistry is more highly selective. This provides a local interconnect arrangement that is better formed than those using a conventional etch stop layer.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of forming a local interconnect, comprising the steps of:
   forming devices on a semiconductor wafer;
   forming silicide regions on the devices;
   depositing a nitrogen-containing etch stop layer over the devices and the silicide regions;
   implanting additional nitrogen into the etch stop layer;
   depositing a dielectric layer on the etch stop layer;
   etching the dielectric layer in accordance with a desired pattern to form a local interconnect opening with an etchant chemistry that is selective to the etch stop layer;
   etching the etch stop layer in accordance with a desired pattern with an etchant chemistry that is selective to the silicide regions; and
   depositing conductive material in the local interconnect opening.

2. The method of claim 1, wherein the etch stop layer comprises at least one of SiON and SiN.

3. The method of claim 2, wherein the step of depositing a nitrogen-containing etch stop layer includes plasma enhanced chemical vapor deposition (PECVD) of at least one of SiON and SiN.

4. The method of claim 3, wherein the step of implanting the additional nitrogen includes implanting nitrogen ions into the etch stop layer.

5. The method of claim 4, wherein the dosage of implanted nitrogen ions is between about $1 \times 10^{12}$ and about $1 \times 10^{16}$ ions/cm$^2$.

6. The method of claim 5, wherein the nitrogen ions are implanted with an energy of between about 15 to about 200 KeV.

7. The method of claim 6, wherein the dielectric layer comprises silicon dioxide derived from tetraethylorthosilicate (TEOS).

8. The method of claim 7, wherein the etchant chemistry selective to the etch stop layer is $C_4F_8$.

9. The method of claim 8, wherein the etchant chemistry selective to the silicide regions is $CH_3FO_2$.

10. The method of claim 9, further comprising depositing a barrier layer in the local interconnect opening.

11. A local interconnect arrangement comprising:
   a substrate layer;
   semiconductor devices on the substrate;
   silicide regions on the semiconductor devices;
   a nitrogen-rich etch stop layer on portions of some of the silicide regions;
   a dielectric layer on the etch stop layer;
   a local interconnect opening extending through the dielectric layer and the etch stop layer to at least one of the silicide regions; and
   conductive material filling the local interconnect opening and contacting at least one of the silicide regions.

12. The arrangement of claim 11, wherein the nitrogen-rich etch stop layer comprises SiON.

13. The arrangement of claim 11, wherein the nitrogen-rich etch stop layer comprises SiN.

14. A method of increasing the selectivity of etchants with respect to an etch stop layer, comprising the steps of:
   forming a silicide region;
   depositing by plasma enhanced chemical vapor deposition a nitrogen containing etch stop layer on the silicide regions;
   implanting nitrogen in the deposited etch stop layer to enrich the nitrogen content of the etch stop layer; and
   forming a dielectric layer on the etch stop layer, wherein the etch rate of the etch stop layer is substantially slower than the etch rate of the dielectric layer when exposed to a first etchant chemistry, and the etch rate of the silicide region is substantially slower than the etch rate of the etch stop layer when exposed to a second etchant chemistry.

15. The method of claim 14, wherein the etch stop layer comprises at least one of SiON and SiN, prior to the implanting of nitrogen.

16. The method of claim 15, wherein the etch stop layer is between about 500 and about 1000 Å thick.

17. The method of claim 16, wherein the nitrogen is implanted as nitrogen ions and the dosage of implanted nitrogen ions is between about $1\times10^2$ and about $1\times10^{16}$ ions/$cm^2$.

18. The method of claim 17, wherein the nitrogen ions are implanted with an energy of between about 15 to about 200 KeV.

* * * * *